(12) United States Patent
Loving

(10) Patent No.: US 11,444,233 B1
(45) Date of Patent: Sep. 13, 2022

(54) JOSEPHSON MAGNETIC MEMORY CELL WITH FERRIMAGNETIC LAYERS HAVING ORTHOGONAL MAGNETIC POLARITY

(71) Applicant: Melissa G. Loving, College Park, MD (US)

(72) Inventor: Melissa G. Loving, College Park, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/219,260

(22) Filed: Mar. 31, 2021

(51) Int. Cl.
| H01L 39/02 | (2006.01) |
| G11C 11/44 | (2006.01) |
| H01L 27/18 | (2006.01) |
| H01L 39/22 | (2006.01) |
| H01L 39/12 | (2006.01) |

(52) U.S. Cl.
CPC ............ H01L 39/025 (2013.01); G11C 11/44 (2013.01); H01L 27/18 (2013.01); H01L 39/12 (2013.01); H01L 39/223 (2013.01)

(58) Field of Classification Search
CPC ....... H01L 39/025; H01L 27/18; H01L 39/12; H01L 39/223; G11C 11/44
See application file for complete search history.

(56) References Cited

U.S. PATENT DOCUMENTS

| 5,295,093 A | 3/1994 | Nagasawa |
| 5,398,030 A | 3/1995 | Sandell |
| 6,418,065 B2 | 7/2002 | Sato et al. |

(Continued)

FOREIGN PATENT DOCUMENTS

| JP | H076329 A | 1/1995 |
| JP | H09128970 A | 5/1997 |

(Continued)

OTHER PUBLICATIONS

Japanese Office Action for Application No. 2020-091149 dated Apr. 20, 2021.

(Continued)

*Primary Examiner* — Matthew L Reames
(74) *Attorney, Agent, or Firm* — Tarolli, Sundheim, Covell & Tummino LLP

(57) ABSTRACT

A hysteretic magnetic Josephson junction (HMJJ) device is provided that comprises a non-magnetic spacer disposed between a first ferromagnetic layer and a second ferromagnetic layer, a first ferrimagnetic layer having a first side disposed on a side of the first ferromagnetic layer opposite the non-magnetic spacer, and a second ferrimagnetic layer having a first side disposed on a side of the second ferromagnetic layer opposite the non-magnetic spacer. The first ferrimagnetic layer and the second ferrimagnetic layer are formed from a composition that provides orthogonally magnetic responses relative to the magnetic responses of the first ferromagnetic layer and the second ferromagnetic layer. The HMJJ further comprises a first superconducting material layer having a first side disposed on a second side of the first ferromagnetic layer and a second superconducting material layer having a first side disposed on a second side of the second ferromagnetic layer.

20 Claims, 4 Drawing Sheets

(56) References Cited

U.S. PATENT DOCUMENTS

| | | | |
|---|---|---|---|
| 6,710,986 | B1 | 3/2004 | Sato et al. |
| 9,214,624 | B2 | 12/2015 | Lee et al. |
| 9,520,180 | B1 | 12/2016 | Mukhanov et al. |
| 9,613,699 | B1 | 4/2017 | Reohr et al. |
| 11,024,791 | B1 | 6/2021 | Murduck et al. |
| 2006/0203587 | A1 | 9/2006 | Li et al. |
| 2013/0040818 | A1 | 2/2013 | Herr et al. |
| 2013/0258772 | A1 | 10/2013 | Lee et al. |
| 2015/0043273 | A1 | 2/2015 | Naaman et al. |
| 2018/0025775 | A1 | 1/2018 | Ambrose |
| 2021/0005249 | A1 | 1/2021 | Naaman et al. |
| 2021/0066572 | A1 | 3/2021 | Ambrose et al. |
| 2022/0102611 | A1* | 3/2022 | Ambrose ............ H01L 27/18 |

FOREIGN PATENT DOCUMENTS

| | | | |
|---|---|---|---|
| JP | 2000090009 | A | 3/2000 |
| JP | 2000091665 | A | 3/2000 |
| JP | 2000268579 | A | 9/2000 |
| JP | 2003318465 | A | 11/2003 |
| JP | 2016535383 | A | 11/2016 |
| WO | 2016094020 | | 6/2016 |
| WO | 2016094020 | A1 | 6/2016 |
| WO | 2018185306 | | 10/2018 |
| WO | 2018185306 | A1 | 10/2018 |
| WO | 2020205031 | A2 | 10/2020 |

OTHER PUBLICATIONS

Zhang Y M et Al: "High-T/sub c/ superconductor oversampled delta modulator for analog-to-digital converters", IEEE Transactions on Applied Superconductivity, IEEE Service Center, Los Alamitos, CA, US, vol. 7, No. 2, Jun. 1, 1997 (Jun. 1, 1997), pp. 2292-2295, XP011500920, ISSN: 1051-8223, DOI: 10.1109/77.621696.

Toshishige Yamada et al: "Current-injection Josephson latch employing a single-flux quantum. II", Journal of Applied Physics, American Institute of Physics, US, vol. 59, No. 9, May 1, 1986 (May 1, 1986), pp. 3202-3207, XP001629332, ISSN: 0021-8979.

European Office Action for Application No. 20188202.4-1206/3764543 dated Apr. 7, 2021.

International Search Report for Application No. PCT/US2020/061835 dated Mar. 4, 2021.

Niedzielski B M et al: "Use of Pd—Fe and Ni—Fe—Nb as Soft Magnetic Layers in Ferromagnetic Josephson Junctions for Nonvolatile Cryogenic Memory", IEEE Transactions on Applied Superconductivity, vol. 24, No. 4, 1800307, Aug. 2014 (Aug. 2014), XP011544947, ISSN: 1051-8223, DOI: 10.1109/TASC.2014.2311442 sections I I , I I I , V; figure 1.

Madden A E et al: "Phase controllable Josephson junctions for cryogenic memory", Superconductor Science and Technology, vol. 32, No. 1, 015001, Nov. 16, 2018 (Nov. 16, 2018), XP020333147, ISSN: 0953-2048, DOI: 10.1088/1361-6668/AAE8CF section 2; figure 1.

Bell C et al: "Controllable Josephson current through a pseudospin-valve structure", Applied Physics Letters, vol. 84 , No. 7 , Feb. 16, 2004 (Feb. 16, 2004), pp. 1153-1155, XP012062116, ISSN: 0003-6951, DOI: 10.1063/1.1646217 p. 1153.

Extended European Search Report for Application No. 21163890.3-1203 dated Jul. 14, 2021.

Australian Examination Report for Application No. 2019308479 dated Jun. 23, 2021.

Non Final Office Action for U.S. Appl. No. 17/021,675 dated Apr. 8, 2021.

* cited by examiner

JOSEPHSON MAGNETIC MEMORY CELL WITH FERRIMAGNETIC LAYERS HAVING ORTHOGONAL MAGNETIC POLARITY

TECHNICAL FIELD

The present invention relates generally to quantum and classical digital superconducting circuits, and specifically to a Josephson magnetic memory cell with ferrimagnetic layers having orthogonal magnetic polarity.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop.

SUMMARY

In one example, a hysteretic magnetic Josephson junction (HMJJ) device is disclosed. The HMJJ comprises a non-magnetic spacer disposed between a first ferromagnetic layer and a second ferromagnetic layer, a first ferrimagnetic layer having a first side disposed on a side of the first ferromagnetic layer opposite the non-magnetic spacer, and a second ferrimagnetic layer having a first side disposed on a side of the second ferromagnetic layer opposite the non-magnetic spacer. The first ferrimagnetic layer and the second ferrimagnetic layer are formed from a composition that provides orthogonally magnetic responses relative to the magnetic responses of the first ferromagnetic layer and the second ferromagnetic layer. The HMJJ further comprises a first superconducting material layer having a first side disposed on a second side of the first ferromagnetic layer and a second superconducting material layer having a first side disposed on a second side of the second ferromagnetic layer, wherein a second side of the first superconducting layer and a second side of the second superconducting layer are configured as opposing galvanic contacts for the MJJ device.

In another example, a Josephson magnetic memory cell system is disclosed that comprises a hysteretic magnetic Josephson junction (HMJJ configured to store a binary value and to convert superconducting pairs associated with a read current flowing through at least one HMJJ from a singlet-state to a triplet-state. The Josephson magnetic memory cell system further comprises a write circuit magnetically coupled to the HMJJ and configured to write the binary value into the HMJJ in response to at least one write current, and a read circuit configured to determine the binary value stored in the HMJJ in response to application of the read current to the HMJJ. The HMJJ comprises a first ferrimagnetic material layer having a fixed magnetization and a second ferrimagnetic material layer having a free magnetization corresponding to a bi-stable orientation, wherein the first and second ferrimagnetic material layers have a magnetic polarity that is substantially orthogonal with respect to a first ferromagnetic layer adjacent the first ferrimagnetic layer and a second ferromagnetic layer adjacent the second ferrimagnetic layer.

DETAILED DESCRIPTION

Figure 1:
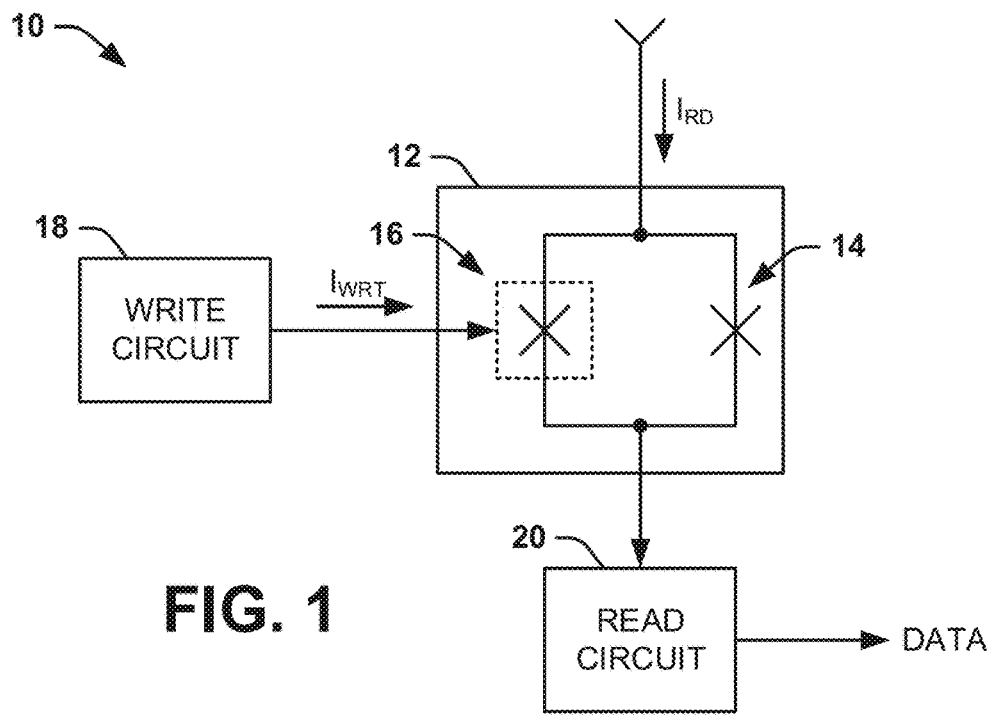
FIG. 1 illustrates an example of a Josephson magnetic memory cell system.

A Josephson magnetic memory cell system can include a hysteretic magnetic Josephson junction (HMJJ) that includes at least one fixed ferrimagnetic material layer and at least one free ferrimagnetic material layer having a bi-stable orientation. At least one of the fixed and free ferrimagnetic material layers can include a magnetic polarity that is substantially orthogonal to the magnetic polarity of the remaining layers. The Josephson magnetic memory cell system can be implemented to store a binary value based on manipulating the magnetic polarity of the at least one free ferrimagnetic material layers. The Josephson magnetic memory cell system can also include a Josephson junction arranged in parallel with the HMJJ. Therefore, the Josephson junction and the HMJJ are cooperatively arranged as a superconducting quantum interference device (SQUID) that can provide an indication of the binary value stored in the HMJJ based on a magnetic flux between the Josephson junction and the HMJJ in response to a read current, such as during a read operation.

As a result of the substantially orthogonal magnetic polarization of at least one of the magnetic layers relative to the remaining magnetic layers, superconducting Cooper pairs associated with the read current that flows through the HMJJ can be converted from a singlet-state to a triplet-state during the read operation. As a result of implementation of a triplet-state current for readout of the HMJJ, superconducting correlations in the Josephson magnetic memory cell system can allow for a larger read current, and can provide substantially greater distinction between logic-states stored in the HMJJ. In addition, triplet-state superconducting Cooper pairs associated with the read current can be substantially less sensitive with respect to a thickness of the magnetic layers of the HMJJ. Accordingly, small variations in thickness of the magnetic material layers associated with the Josephson magnetic memory cell system due to fabrication tolerances can be substantially irrelevant with respect to operation of the Josephson magnetic memory cell system.

Superconducting Josephson junctions with magnetic barriers, also referred to as magnetic Josephson junctions (MJJs), can serve as the basis for Josephson magnetic random access memory (JMRAM), as disclosed in U.S. Pat. No. 8,270,209 (hereinafter, "the '209 patent"), entitled "Josephson Magnetic Random Access Memory System and Method," which is herein incorporated by reference. JMRAM relies on the oscillation of the relative Cooper pair phase with magnetic layer thickness to produce junctions that exhibit a Josephson phase of either zero or π, depending on the relative magnetic layer orientation. This binary phase switchability can be exploited to create superconducting memory elements capable of storing a logical "0" or logical "1" state. Memory unit elements can be arranged in arrays with read and write lines to create an addressable memory fabricated, for example, on an integrated circuit (IC) chip that can be cooled to cryogenic temperatures (e.g., around four Kelvin).

In accordance with the present disclosure, a hysteric magnetic Josephson junction (HMJJ) is disclosed with orthogonally oriented magnetic layers (i.e., polarizing layers) formed from ferrimagnetic material (FIM) layers. The key feature of the hysteretic magnetic Josephson junction (HMJJ) described by the '209 patent is the readout operation. In the HMJJ, readout occurs when a spin singlet state is converted into a spin triplet state. This conversion in the spin state (spin up/spin down to spin up/spin up; spin down/spin down) is reliant on a magnetic layer, which has a magnetization vector oriented orthogonal to the fixed/free ferromagnetic layers. At selected compositions, it has been determined that ferrimagnetic materials can exhibit a strong perpendicular magnetic anisotropy in a specified composition regime and may therefore be incorporated as the perpendicular magnetic layer of the HMJJ. Implementation of such a layer should be compatible with maintaining high critical current densities through the junction.

Ferrimagnetic (FIM) materials are comprised of 4f valence configured rare earth element paired with a 3d magnetic transition metal (e.g. Fe—Gd, Fe—Co, Dy—Co etc.). This configuration results in atoms with opposing magnetic moments that may be unbalanced and greater than zero. Many FIM materials demonstrate a strong perpendicular magnetic anisotropy (PMA) that is tunable depending on the alloy composition. In one example, the FIM material layers are formed from a ferrimagnetic Fe1-xGdx (e.g., a composition of Fe80Gd20) with a thickness of about 2 nanometers to about 20 nanometers (e.g., 10 nanometers), such that the film magnetization will orient itself perpendicular to the plane.

The HMJJ described in the '209 patent uses a standard orthogonally oriented ferromagnetic material that orients itself perpendicular to the film plane (e.g. [Co/Pd]N multilayers). The incorporation of a single layer of ferrimagnetic material for both the fixed and free orthogonally oriented magnetic layers allows for increased versatility with regard to critical current, film thickness and perpendicular magnetic anisotropy (PMA) requirements. Additionally, the use of a single layer as opposed to a multilayer structure of typical ferromagnetic PMA will decrease the overall stack complexity, processing and may provide a pathway for higher achievable critical current densities. The increased complexity of a HMJJ due to incorporation of a ferromagnetic multilayer with perpendicular anisotropy may result in unnecessary losses in critical current densities. A single ferrimagnetic layer with strong PMA may achieve similar read back with higher critical current densities, less overall stack complexity and processing times.

Ferromagnetic material layer can also, for example, be made of any one of elemental nickel (Ni), elemental cobalt (Co), elemental iron (Fe), a cobalt-iron alloy (e.g., 1:1 CoFe), a nickel-iron binary alloy (NiFe), or a nickel-iron ternary alloy (e.g., NiFeCr). In one example, at least one of the ferromagnetic material layers can, for example, be formed of 80:20 nickel-iron permalloy ($Ni_{80}Fe_{20}$) and can have a thickness of between about 0.5 nanometers and about two nanometers (e.g., about 1.6 nanometers). The different alloys from which the ferromagnetic material layer can be formed with a variety of different alloy concentrations to provide variable magnetic orientation properties and maintains critical current transparency.

FIG. 1 illustrates an example of a Josephson magnetic memory cell system 10 in accordance with an aspect of the invention. The Josephson magnetic memory cell system 10 includes a memory cell 12 that can correspond to a single memory cell, such as can be included in a memory array of a random access memory (RAM). The memory cell 12 includes a Josephson junction 14 and a hysteretic magnetic Josephson junction (HMJJ) 16 arranged in parallel, such that the Josephson junction 14 and the HMJJ 16 are cooperatively arranged as a superconducting quantum interference device (SQUID). It is to be understood that the Josephson junction 14 may also be configured as an HMJJ, and may either be in a static state or may participate together with HMJJ 16 in the storage of a binary value, as described herein.

As an example, the HMJJ 16 can include at least one fixed ferrimagnetic material layer and at least one free ferrimagnetic material layer having a bi-stable orientation. At least one of the fixed and free ferrimagnetic material layers of the HMJJ 16 can include a magnetic polarity that is substantially orthogonal to the magnetic polarity of the remaining layers. As described in greater detail herein, the substantially orthogonal magnetic polarity can be configured to convert superconducting Cooper pairs associated with a read current $I_{RD}$ from a singlet-state to a triplet-state during a read operation. As a result, the logic-state stored in the HMJJ 16 can be better distinguished during the read operation, and the HMJJ 16 can be substantially insensitive to manufacturing tolerances.

For example, the HMJJ 16 can be configured to store a binary value (e.g., a logic 1 or a logic-0) based on a magnetic polarization of the free ferrimagnetic material layer. In the example of FIG. 1, the Josephson magnetic memory cell system 10 includes a write circuit 18 configured to generate at least one write current $I_{WRT}$ on a write-line that is magnetically coupled to the HMJJ 16. The write current(s) $I_{WRT}$ can generate a magnetic field to set the binary value of the HMJJ 16 to a binary logic-1 or a binary logic-0 based on respective directions of current flow during a data write operation. As an example, the write circuit 18 can be part of a peripheral write circuit for an entire array of memory cells that includes the Josephson magnetic memory cell system 10.

The binary value that is stored in the HMJJ 16 can be read from the Josephson magnetic memory cell system 10 during a read operation in response to a read current $I_{RD}$. As an example, the read current $I_{RD}$ can correspond to a bit read current that is applied to an entire column of memory cells in the array, or can be individually generated for the Josephson magnetic memory cell system 10. The read current $I_{RD}$ is provided to Josephson junction 14 and the HMJJ 16 at a magnitude that corresponds to the respective critical currents of the Josephson junction 14 and the HMJJ 16. For example, the Josephson junction 14 can have a critical current ($I_{C2}$) that is static and the HMJJ 16 can have a critical current ($I_{C1}$) that varies based on the orientation of the magnetic polarity of the free ferrimagnetic material layer, and thus based on the binary value that is stored therein. For example, the HMJJ 16 can be configured to have a critical current having a given magnitude when storing a logic-0 as the binary value and can have a critical current of approximately the same magnitude but opposite direction when storing a logic-1. The HMJJ 16 can thus be configured as a "0-junction" when storing a first logic-state as the binary value and as a "pi-junction" when storing the second logic-state as the binary value. Therefore, in response to the read current $I_{RD}$, the Josephson junction 14 and the HMJJ 16 can trigger a voltage pulse based on their respective critical currents which can result in a total critical current of the memory cell 12 that is approximately equal to $I_{C2}+I_{C1}$ when storing a first state of the binary value and approximately equal to $I_{C2}-I_{C1}$ when storing a second state of the binary value. The difference in the response of the HMJJ 16 between the first and second logic-states of the stored binary value can result in variation of the magnetic flux between the Josephson junction 14 and the HMJJ 16. Accordingly, the magnetic flux between the Josephson junction 14 and the HMJJ 16 can be indicative of the binary value stored in the HMJJ 16.

In the example of FIG. 1, the Josephson magnetic memory cell system 10 includes a read circuit 20. The read circuit 20 is configured to determine the binary value that is stored in the HMJJ 16 in response to the read current $I_{RD}$, demonstrated in the example of FIG. 1 as a signal DATA corresponding to the stored binary value. The read circuit 20 can determine the binary value in any of a variety of ways, such as based on sensing current magnitude, voltage pulses, or the magnetic flux between the Josephson junction 14 and the HMJJ 16. For example, the read circuit 20 can be configured to generate a peripheral current through an inductor (not shown) that is magnetically coupled to the memory cell 12, such that the magnitude of the peripheral current changes based on the magnetic flux between the Josephson junction 14 and the HMJJ 16, thus indicating the binary value stored in the HMJJ 16. Thus, while it is demonstrated in the example of FIG. 1 that the read circuit 20 is conductively coupled to the memory cell 12, it is to be understood that the read circuit 20 can instead be coupled to the memory cell 12 in a variety of different ways.

As described previously, the HMJJ 16 includes at least one fixed ferrimagnetic material layer and at least one free ferrimagnetic material layer having a bi-stable orientation, and that at least one of the fixed and free ferrimagnetic material layers of the HMJJ 16 can include a magnetic polarity that is substantially orthogonal to the magnetic polarity of the remaining layers. The arrangement of the HMJJ 16 can be formed in a variety of different ways.

Figure 2:
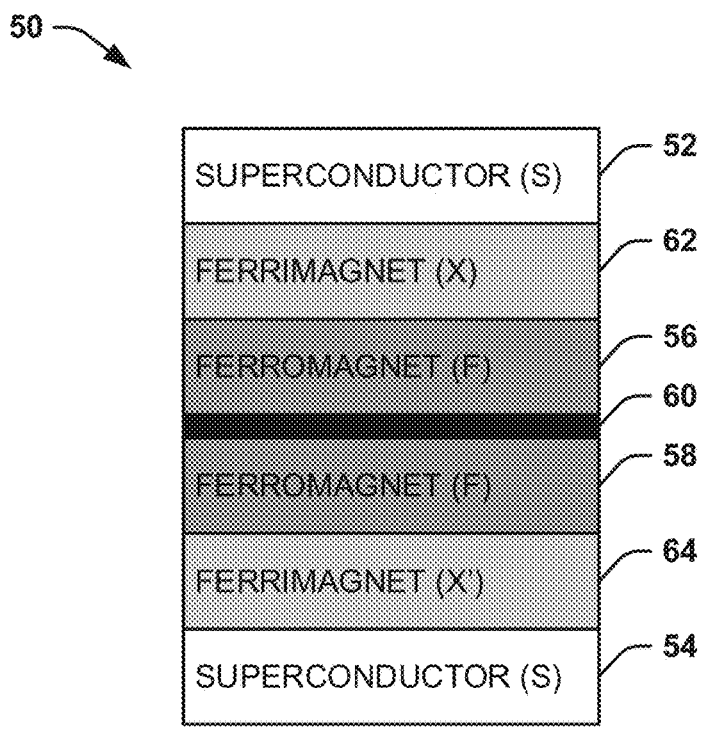
FIG. 2 illustrates an example of a hysteretic magnetic Josephson junction (HMJJ).

FIG. 2 illustrates an example of an HMJJ 50 in accordance with an aspect of the invention. The HMJJ 50 can correspond to the HMJJ 16 in the example of FIG. 1. Therefore, reference is to be made to the example of FIG. 1 in the following description of the example of FIG. 2. The HMJJ 50 includes a first superconducting electrode layer 52 and a second superconducting electrode layer 54, both denoted as (S). For example, the first and second superconducting electrode layers 52 and 54 can be formed from a variety of superconducting materials, such as Niobium (Nb), niobium nitride or aluminum to name a few. As an example, the second superconducting electrode layer 54 can be a base electrode and have a thickness of between about one hundred nanometers and about two hundred nanometers (e.g., about one hundred and fifty nanometers), and the first superconducting electrode layer 52 can be a top electrode and can have a thickness of between about twenty nanometers and about one hundred nanometers (e.g., about fifty nanometers). The first and second superconducting electrode layers 52 and 54 can be directly coupled to an associated bit-read line on which the read current $I_{RD}$ flows, such that the bit-read lines can likewise be formed from the superconducting material.

The HMJJ 50 also includes a first ferromagnetic layer 56 and a second ferromagnetic layer 58, both denoted as (F), that are separated by a non-magnetic spacer layer 60. The non-magnetic spacer layer 60 can be fabricated, for example, of any one of elemental copper (Cu), elemental ruthenium (Ru), elemental iridium (Ir), or elemental rhodium (Rh) or multilayer structure such as Cu/Ru. The non-magnetic spacer layer 60 can have a thickness of, for example, between about 2.5 nanometers and about 7.5 nanometers (e.g., about 5.0 nanometers). The first and second ferromagnetic layers 56 and 58 can be fixed ferromagnetic layers, such that they have a substantially fixed magnetic polarity that can be anti-parallel with respect to each other. As an example, the first and second ferromagnetic layers 56 and 58 can be formed from a ferromagnetic material, such as elemental or an alloy of cobalt (Co), Nickel (Ni) or iron (Fe), or a synthetic antiferromagnetic (SAF) material. The first ferromagnetic layer 56 can be made of any one of elemental nickel (Ni), elemental cobalt (Co), elemental iron (Fe), a cobalt-iron alloy (e.g., 1:1 CoFe), a nickel-iron binary alloy (NiFe), or a nickel-iron ternary alloy (e.g., NiFeCr). The second ferromagnetic layer 58 can, for example, be made of 80:20 nickel-iron permalloy ($Ni_{80}Fe_{20}$). The first and second ferromagnetic layers can each have a thickness of between about 0.5 nanometers and about two nanometers (e.g., about 1.6 nanometers). In the case of each alloy mentioned, many different alloy concentrations or other alloy combinations can be used, provided that the alloy concentration is magnetic and the ferromagnetic layers maintain critical current transparency.

The HMJJ 50 further includes a first ferrimagnetic layer 62 with sides adjacent and interconnecting the first superconducting electrode layer 52 and the first ferromagnetic layer 56, and a second ferrimagnetic layer 64 with sides adjacent and interconnecting the second superconducting electrode layer 54 and the second ferromagnetic layer 58. In the example of FIG. 2, the first and second ferrimagnetic layers 62 and 64 are demonstrated as X and X', respectively. The first and second ferrimagnetic layers 62 and 64 can be formed from a single ferrimagnetic material layer chosen from among the ferrimagnetic materials with the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal elected from among iron (Fe), nickel (Ni), or cobalt (Co), e.g., $Gd_xFe_{1-x}$, $Gd_xCo_{1-x}$, $Dy_xCo_{1-x}$, etc., where 0<x<1. The first and second ferrimagnetic layers 62 an 64 can each have a thickness of between about 2 nanometers to about 20 nanometers (e.g., 10 nanometers).

At least one of the first and second ferrimagnetic layers 62 and 64 can have a magnetic polarity that is substantially orthogonal with respect to the magnetic polarity associated with the first and second ferromagnetic layers 56 and 58. In the example of FIG. 2, the first ferrimagnetic layer (i.e., X) is a fixed magnetic material layer, but the second ferrimagnetic layer 64 (i.e., X') can be a free magnetic material layer, such that the free magnetic material layer has a bi-stable orientation that permits a variable magnetic polarity therein. Therefore, the magnetic polarity of the free magnetic material layer can be set as a result of magnetic fields generated locally by orthogonal electrical currents, such as the at least one write current $I_{WRT}$. Such magnetic polarity can affect the magnitude and/or sign of the critical current of the HMJJ 50, as described previously. Accordingly, the binary value can be stored in the HMJJ 50 based on the magnetic polarity of the free magnetic material of one of the first and second ferrimagnetic layers 62 and 64.

As a result of the substantially orthogonal magnetic polarity of at least one of the first and second ferrimagnetic layers 62 and 64, the angular momentum of superconducting Cooper pairs of a tunneling current flowing through the HMJJ 50 (e.g., the read current $I_{RD}$) can be manipulated to convert the superconducting Cooper pairs from a singlet-state (spin-up/spin-down) to a triplet-state (spin-up/spin-up or spin-down/spin-down). The conversion of the superconducting pairs from the singlet-state to the triplet-state can be achieved with maximum effect based on both of the first and second ferrimagnetic layers 62 and 64 having a substantially orthogonal magnetic polarity relative to the magnetic polarity of the first and second ferromagnetic layers 56 and 58.

As a result of the conversion of the superconducting pairs from the singlet-state to the triplet-state, the HMJJ 50 can exhibit a number of advantages over typical superconductor-based memory cells, such as those that implement singlet-state tunneling currents for readout. For example, the triplet-state tunneling current (e.g., the read current $I_{RD}$) flowing through the HMJJ 50 can have a substantially greater magnitude than a singlet-state tunneling current, particularly when the thickness of the magnetic layers 56 and 58 is greater than a few nanometers. Therefore, the readout of the binary value can be substantially improved based on improved readout contrast between the logic-states of the binary value stored in the HMJJ 50, and the thickness of the magnetic layers 56, 58, 62, and 64 can be greater than typical superconductor-based memory cells. As another example, the magnitude of the triplet-state current can be substantially insensitive to small variations in the thickness of the magnetic layers 56, 58, 62, and 64. Therefore, variations of the thicknesses of the magnetic layers 56, 58, 62, and 64 due to fabrication tolerances during manufacture of the Josephson magnetic memory cell system 10 can be substantially irrelevant to the readout of the HMJJ 50. As another example, the spin-up/spin-up or spin-down/spin-down electron-pair orientation of the triplet-state can result in the triplet-state tunneling current being substantially sensitive to majority/minority band effects that can give rise to tunneling magnetoresistance (TMR) effect, which is substantially absent for singlet-state tunneling current that contains equal numbers of spin-up and spin-down electrons and which substantially concurrently samples both majority and minority bands. Accordingly, the HMJJ 50 can be configured as a "toggle-MRAM" having significantly enhanced write margins.

Figure 3:
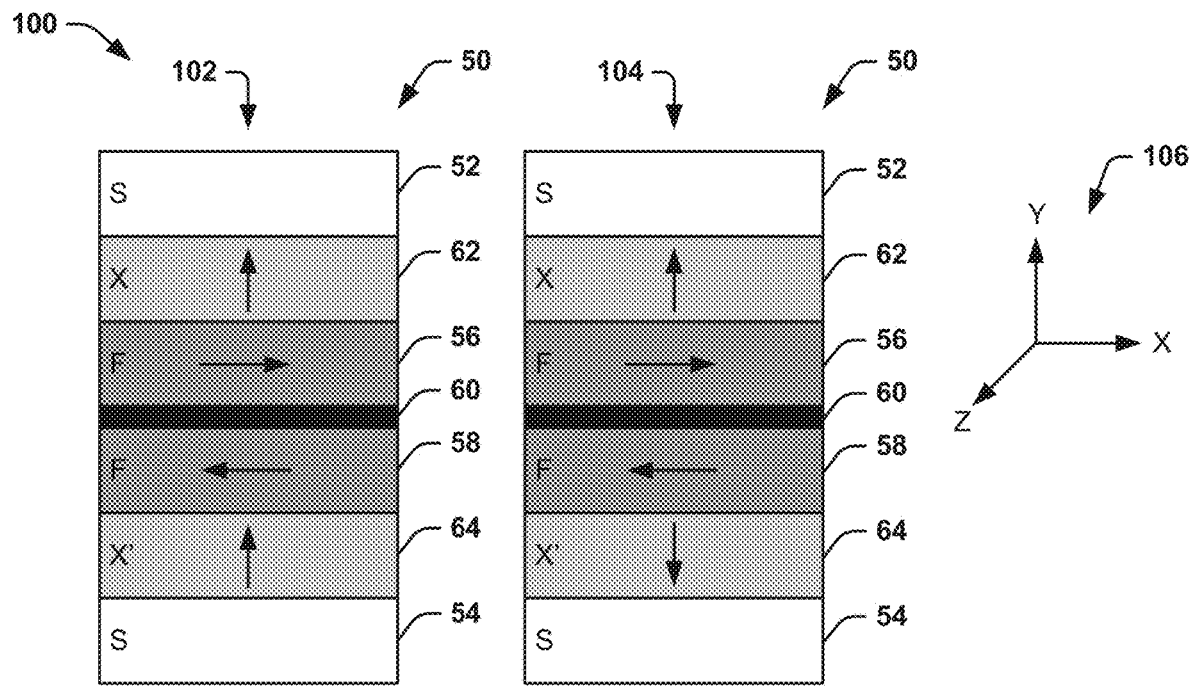
FIG. 3 illustrates an example of a diagram of two states of an HMJJ.

FIG. 3 illustrates an example of a diagram 100 of two states of the HMJJ 50 in accordance with an aspect of the invention. The diagram 100 includes a first state 102 corresponding to a first logic-state of the binary value stored in the HMJJ 50 and a second state 104 corresponding to a second logic-state of the binary value stored in the HMJJ 50. It is to be understood that the specific logic-states associated with the first and second states 102 and 104 can be arbitrary depending on the associated readout system. The diagram 100 demonstrates magnetic polarities in the magnetic layers 56, 58, 62, and 64 based on a Cartesian coordinate system 106.

In the first state 102, the first ferromagnetic layer 56 has a first magnetic polarity in the +X direction and the second ferromagnetic layer 58 has a second magnetic polarity in the −X direction, and which is thus substantially anti-parallel with respect to the first magnetic polarity. In addition, the first ferrimagnetic layer 62 and the second ferrimagnetic layer 64 have magnetic polarities in the +Y direction, and which are thus parallel with respect to each other and substantially orthogonal to the first and second magnetic polarities. It is to be understood that, while the magnetic polarities of the first and second ferrimagnetic layers 62 and 64 are demonstrated in the +Y direction, it is to be understood that the polarities of the first and second ferrimagnetic layers 62 and 64 could instead both be in the −Y direction, the +Z direction, or the −Z direction, such that they are substantially orthogonal to the first and second magnetic polarities. As described previously, the first ferrimagnetic layer 62 is a fixed magnetic material, such that the magnetic polarity is static. However, the second ferrimagnetic layer 64 can be a free magnetic material layer, such that the magnetic polarity of the second ferrimagnetic layer 64 can be set to the orientation in the first state 102 based on at least one write current (e.g., the write current $I_{WRT}$).

In the second state 104, the magnetic polarities of the first and second ferromagnetic layers 56 and 58 and the first ferrimagnetic layer 62 remain the same as in the first state 102, based on the first and second ferromagnetic layers 56 and 58 and the first ferrimagnetic layer 62 being formed as fixed magnet material layers. However, in the second state 104, the second ferrimagnetic layer 64 has a magnetic polarity in the −Y direction, which is thus anti-parallel with respect to the magnetic polarity of the first ferrimagnetic layer 62 and remains substantially orthogonal to the first and second magnetic polarities. Therefore, in the second state 104, the magnetic polarity of the second ferrimagnetic layer 64 is set to the opposite orientation as that in the first state 102 based on at least one write current (e.g., the write current $I_{WRT}$) to change the sign of the critical current of the HMJJ 50. Accordingly, the magnetic polarity of the second ferrimagnetic layer 64 can dictate the binary value that is stored in the HMJJ 50.

Figure 4:
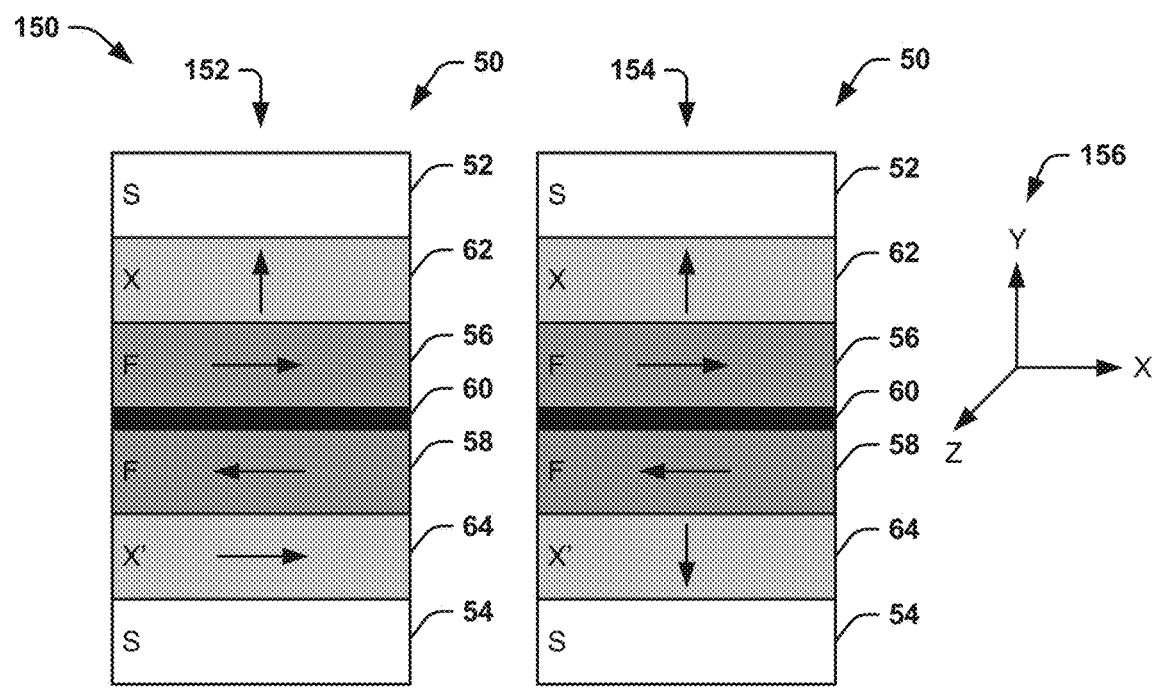
FIG. 4 illustrates another example of a diagram of two states of an HMJJ.

FIG. 4 illustrates another example of a diagram 150 of two states of the HMJJ 50 in accordance with an aspect of the invention. The diagram 150 includes a first state 152 corresponding to a first logic-state of the binary value stored in the HMJJ 50 and a second state 154 corresponding to a second logic-state of the binary value stored in the HMJJ 50. Similar to as described previously in the example of FIG. 2, it is to be understood that the specific logic-states associated with the first and second states 152 and 154 can be arbitrary depending on the associated readout system. The diagram 150 demonstrates magnetic polarities in the magnetic layers 56, 58, 62, and 64 based on a Cartesian coordinate system 156.

In the first state 152, the first ferromagnetic layer 56 has a first magnetic polarity in the +X direction and the second ferromagnetic layer 58 has a second magnetic polarity in the −X direction, and which is thus substantially anti-parallel with respect to the first magnetic polarity. In addition, the first ferrimagnetic layer 62 has a magnetic polarity in the +Y direction which is thus substantially orthogonal to the first and second magnetic polarities, and the second ferrimagnetic layer 64 has a magnetic polarity in the +X direction, which is substantially parallel with the first magnetic polarity. As described previously, the first ferrimagnetic layer 62 is a fixed magnetic material, such that the magnetic polarity is static. However, the second ferrimagnetic layer 64 can be a free magnetic material layer, such that the magnetic polarity of the second ferrimagnetic layer 64 can be set to the orientation in the first state 152 based on at least one write current (e.g., the write current $I_{WRT}$).

In the second state 154, the magnetic polarities of the first and second ferromagnetic layers 56 and 58 and the first ferrimagnetic layer 62 remain the same based on the first and second ferromagnetic layers 56 and 58 and the first ferrimagnetic layer 62 being formed as fixed magnet material layers. However, in the second state 154, the second ferrimagnetic layer 64 has a magnetic polarity in the −Y direction, which is thus anti-parallel with respect to the magnetic polarity of the first ferrimagnetic layer 62 and is substantially orthogonal to the first and second magnetic polarities. Therefore, in the second state 154, the magnetic polarity of the second ferrimagnetic layer 64 is rotated substantially 90° relative to the first state 152 based on at least one write current (e.g., the write current $I_{WRT}$).

For example, the second ferrimagnetic layer 64 can be formed from a magnetic material having a bi-axial anisotropy, such that the magnetic polarity can be set orthogonally on easy axes with respect to the first and second states 152 and 154. For example, the magnetic polarities of the second ferrimagnetic layer 64 in each of the first and second states 152 and 154 can be set based on a relative magnitude of two write currents $I_{WRT}$ to adjust a magnetic polarity vector in the second ferrimagnetic layer 64. As described previously, the conversion of the superconducting pairs from the singlet-state to the triplet-state can be achieved with maximum effect based on both of the first and second ferrimagnetic layers 62 and 64 having a substantially orthogonal magnetic polarity relative to the magnetic polarity of the first and second ferromagnetic layers 56 and 58. Therefore, in the first state 152, the HMJJ 50 can exhibit substantially diminished conversion of the superconducting pairs to the triplet-state. As a result, the HMJJ 50 in the example of FIG. 4 can be fabricated in a manner that the thickness of the magnetic layers 56 and 58 can be sufficient to substantially prevent a predominantly singlet-state tunneling current from flowing through the HMJJ 50 in the first state 152. In the second state 154, with both of the first and second ferrimagnetic layers 62 and 64 being substantially orthogonal to the first and second magnetic polarities, and thus having maximum conversion of the superconducting pairs to the triplet-state, the predominantly triplet-state tunneling current can flow through HMJJ 50. Accordingly, the binary value that is stored in the HMJJ 50 in the example of FIG. 4 can be read from the HMJJ 50 based on whether the tunneling current (i.e., the read current $I_{RD}$) flows through the HMJJ 50.

It is to be understood that the HMJJ 50 is not intended to be limited to the example of FIGS. 2-4. For example, the layers of the HMJJ 50 need not be formed in the specific order and orientation demonstrated in the example of FIG. 2. For example, the location of the nonmagnetic spacer layer 60 relative to the magnetic layers 56, 58, 62, and 64 can be substantially interchangeable. Additionally, while the magnetic layers 56, 58, 62, and 64 and the superconducting electrode layers 52 and 54 are demonstrated as having substantially equal thickness, the thicknesses of the layers can vary relative to each other as discussed above in the present examples.

Figure 5C:
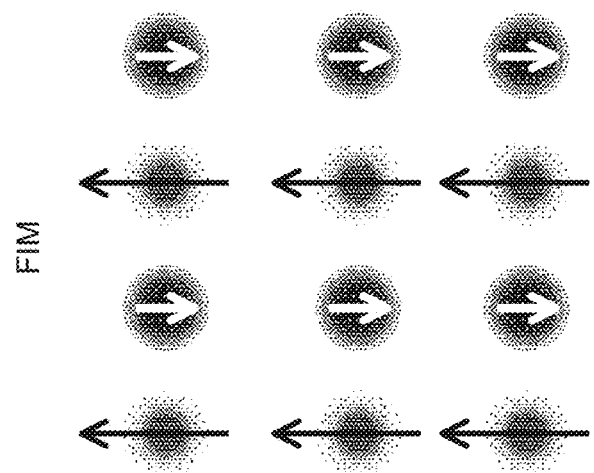
FIGS. 5A-5C are spin magnetic moment vector alignment diagrams for example ferromagnetic, antiferromagnetic, and ferrimagnetic materials, respectively.
Figure 5B:
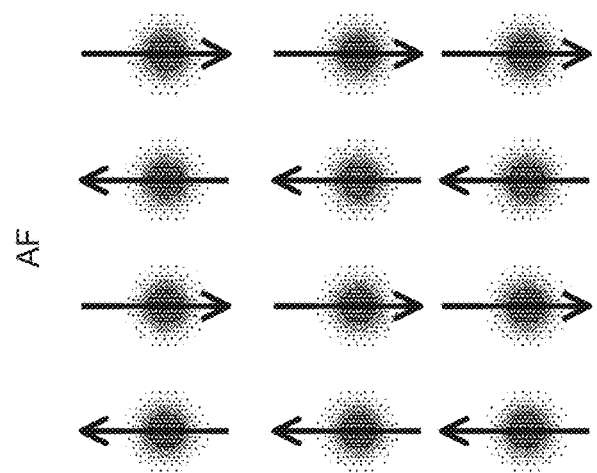
Figure 5A:
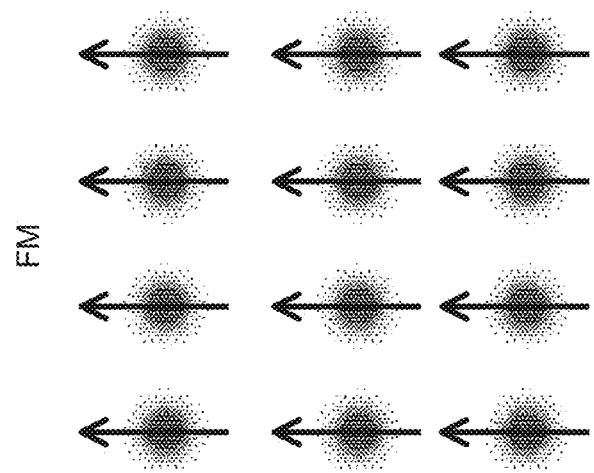

FIGS. 5A-5C show schematic representations providing general descriptions of three different classes of magnetic materials (i.e. antiferromagnetic, ferromagnetic and ferrimagnetic, respectively). The shaded circular areas represent atomic nuclei, whereas the arrows each represent a moment vector corresponding to the magnetic spin of each atomic nucleus. FIG. 5A illustrates an atomic spin representation of a ferromagnetic (FM) structure having a net spin magnetic moment greater than zero. FIG. 5B illustrates an atomic spin representation of an antiferromagnetic (AF) structure having antiparallel magnetic moments that cancel each other out to result in a net spin magnetic moment of zero. FIG. 5C illustrates an atomic spin representation of ferrimagnetic (FIM) structures, typically an alloy, as of a rare earth metal and a transition metal, (e.g., gadolinium iron), having uncompensated spins such that the net magnetic moment is greater than zero, but still with an antiparallel configuration of the moments.

Like an antiferromagnetic material, a ferrimagnetic material has populations of atoms with opposing magnetic moments, but unlike in an antiferromagnetic material, when the populations consist of different materials or ions, the opposing moments are unequal and a spontaneous magnetization remains in a ferrimagnetic material, such that the magnetization of a ferrimagnetic material is unbalanced greater than zero. Ferrimagnets thus differ from antiferromagnets in that, although they exhibit an antiparallel coupling structure of the spin magnetic state ferrimagnets have an uncompensated moment. When a ferrimagnetic layer is implemented as part of a magnetic bilayer as described herein, this uncompensated moment can permit maintenance of a superconducting critical current through an MJJ layer stack while also improving the fixedness of the fixed magnetic layer as well as improving coherent switching in the free magnetic layer of the MJJ stack.

Similar to ferromagnetic materials, ferrimagnetic materials exhibit a spontaneous and net magnetization at room temperature, consist of magnetically saturated domains, and exhibit magnetic hysteresis. Ferrimagnetic materials also have an additional compensation temperature $T_{comp}$ at which the total magnetization is zero due to balancing of the two spin lattices, and above which the ferrimagnetic materials become paramagnetic or non-magnetic at their individual Curie temperatures Tc. Unlike conventional ferromagnetic materials, ferrimagnetic materials typically exhibit a compensation temperature $T_{comp}$ corresponding to each ferromagnetic material in the binary system and a spin-flip transition at high magnetic fields.

Figure 6:
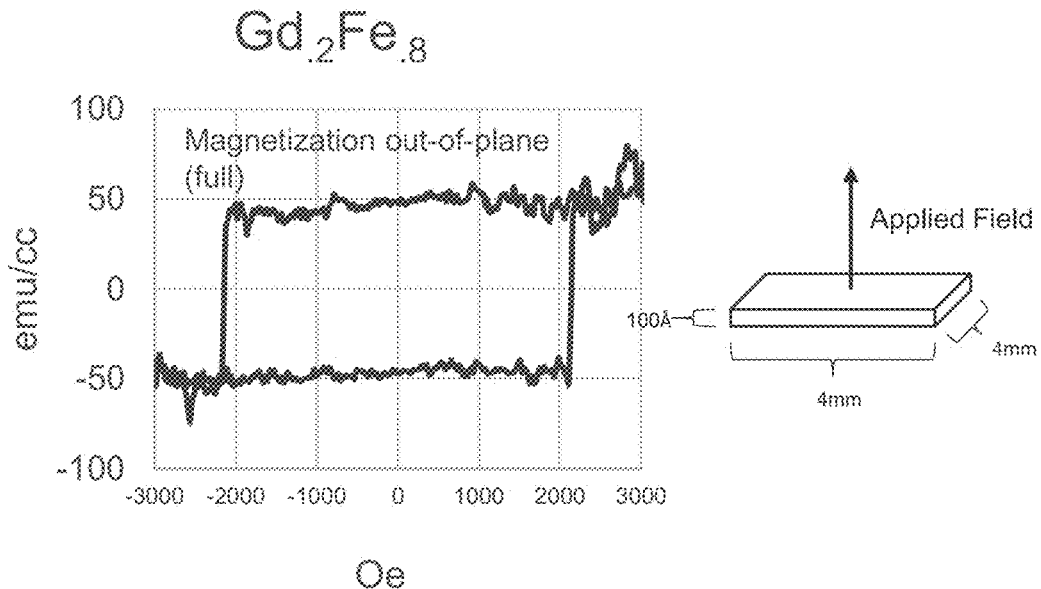
FIG. 6 illustrates a graph of magnetic response of a single ferrimagnetic layer.

FIG. 6 illustrates a graph of an example of magnitude of applied magnetic field versus magnetization response for a ferrimagnetic layer having the composition of 20% gadolinium and 80% Iron. The magnitude of the applied magnetic field (H) is given in units of Oersteds (Oe), while the magnetic response is given in electromagnetic units (emu) per centimeter cubed (cc). The measurement configuration of the ferrimagnetic layer is shown adjacent the graph; the measured ferrimagnetic has a 4×4 mm$^2$ area (length and width) with a thickness of 10 nanometers. The applied field is orthogonal to the length and width of the ferrimagnetic layer. As illustrated in the graph, the ferrimagnetic layer has first response with no magnetic field applied and a full magnetization out-of-plane response to the applied magnetic field. Other variations and percentages of composition of materials to form the ferrimagnetic material layer may have different out-of-plane responses to the same applied magnetic field.

Figure 7:
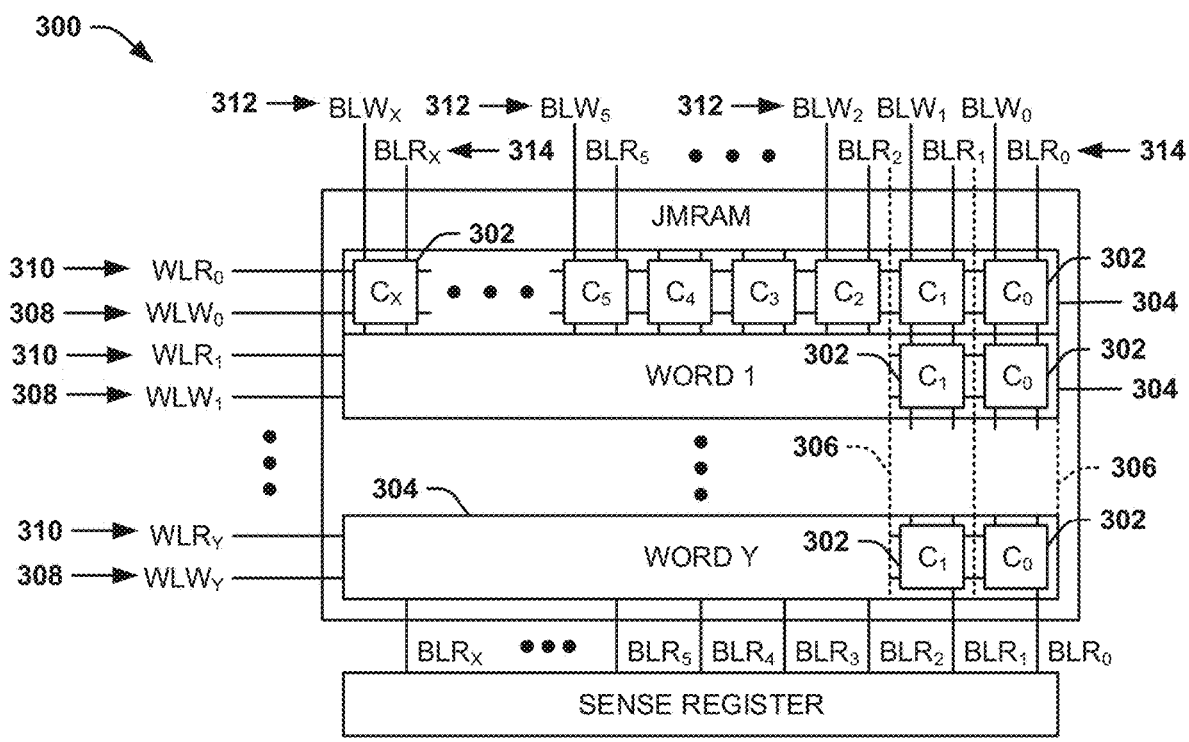
FIG. 7 illustrates an example of a Josephson magnetic random access memory (JMRAM) system.

FIG. 7 illustrates an example of a Josephson magnetic random access memory (JMRAM) system 300 in accordance with an aspect of the invention. The JMRAM system 300 can be implemented as a memory structure in a variety of quantum and/or classical computing applications. As an example, the JMRAM system 300 can be configured cryogenically in a quantum computing circuit, such as operating at approximately 4 Kelvin or less, to store classical data and/or controller instructions in a quantum computing environment.

The JMRAM system 300 is demonstrated in the example of FIG. 6 as being arranged as an array of memory cells 302. Specifically, the memory cells 302 are arranged in rows 304 that each correspond to a data word, demonstrated as WORD O through WORD Y, where Y is an integer greater than 1. Each of the rows 304 includes a set of memory cells 302 that form X columns 306 across the rows 304, with the memory cells 302 in WORD O being demonstrated in the example of FIG. 7 as $C_O$ to $C_X$, where X is an integer greater than 1. Therefore, each of the memory cells 302 in the array of the JMRAM system 300 can be individually addressable by row 304 and column 306.

In the example of FIG. 7, each of the rows 304 is demonstrated as having an associated word-write line 308 and word-read line 310, demonstrated as $WLW_O$ and $WLR_O$ through $WLW_Y$ and $WLR_Y$, respectively. The word-write line 308 and word-read line 310 can be inductively and/or magnetically coupled to each of the memory cells 302 in each of the rows 304 of the JMRAM system 300. In addition, each of the memory cells 302 is demonstrated as having an associated bit-write line 312 and bit-read line 314, demonstrated as $BLW_O$ and $BLR_O$ through $BLW_Y$ and $BLR_Y$, respectively. The bit-write line 312 and bit-read line 314 can be coupled to each corresponding numbered memory cell 302 in each of the rows 304 of the JMRAM system 300, such that the memory cells 302 in each column 306 are arranged in series with respect to the bit-write line 312 and bit-read line 314.

Each of the memory cells 302 is configured to store a single bit of data. Specifically, each of the memory cells 302 can be configured substantially similar to the memory cell 12 in the example of FIG. 1. Specifically, each of the memory cells 302 can include an HMJJ, such as similar to the HMJJ 50 or 200 in the example of FIG. 2 that can be configured to store the binary value corresponding to a binary logic-1 or a binary logic-0. The binary value can be set in response to a word-write current that is provided on the respective word-write line 308 and a bit-write current that is provided on the respective bit-write line 312, such as to change a magnetic polarity of at least one free magnetic material layer. Similarly, the respective digital state that is stored in each of the memory cells 302 can be read from the memory cells 302 based on a word-read current that is provided on the respective word-read line 310 to select a given one of the rows 304 and a bit-read current that is provided on the respective bit-read line 314. Specifically, the bit-read line 314 of each of the columns 306 is coupled to a sense register 316 that is configured to determine whether the binary value of each of the memory cells 302 of an associated row 304 corresponds to a binary logic-1 state or a binary logic-0 state in response to the word-read current and the bit-read current during a read operation. As an example, the sense register 316 can measure a voltage or a current associated with the bit-read line 314, or a magnetic flux in each of the respective memory cells 302, as described in the example of FIG. 1.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A hysteretic magnetic Josephson junction (HMJJ) device comprising:
   a non-magnetic spacer disposed between a first ferromagnetic layer and a second ferromagnetic layer;
   a first ferrimagnetic layer having a first side disposed on a side of the first ferromagnetic layer opposite the non-magnetic spacer;
   a second ferrimagnetic layer having a first side disposed on a side of the second ferromagnetic layer opposite the non-magnetic spacer, the first ferrimagnetic layer and the second ferrimagnetic layer being formed from a composition that provides orthogonally magnetic responses relative to the magnetic responses of the first ferromagnetic layer and the second ferromagnetic layer; and
   a first superconducting material layer having a first side disposed on a second side of the first ferromagnetic layer and a second superconducting material layer having a first side disposed on a second side of the second ferromagnetic layer, wherein a second side of the first superconducting layer and a second side of the second superconducting layer are configured as opposing galvanic contacts for the MJJ device.

2. The device of claim 1, wherein the first ferrimagnetic layer and the second ferrimagnetic layer are formed from a composition of material with the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal selected from among iron (Fe), nickel (Ni), or cobalt (Co), where $0<x<1$.

3. The device of claim 2, wherein the first ferrimagnetic layer and the second ferrimagnetic layer are each formed from a gadolinium (Gd) and Iron (Fe) alloy.

4. The device of claim 3, wherein the first ferrimagnetic layer and the second ferrimagnetic layer are each formed from a composition of about 20% gadolinium (Gd) and 80% Iron (Fe).

5. The device of claim 1, wherein the first ferromagnetic layer is made of any of elemental cobalt, elemental iron, a cobalt-iron alloy, a nickel-iron alloy, or a nickel-iron-chromium alloy.

6. The device of claim 5, wherein the second ferromagnetic layer is a nickel-iron 80:20 permalloy.

7. The device of claim 1, wherein the first superconducting material layer and the second superconducting material layer are formed from one of niobium, niobium nitride, and aluminum.

8. The device of claim 1, wherein the non-magnetic spacer layer is made of at least one of elemental copper (Cu), elemental ruthenium (Ru), elemental iridium (Ir), elemental rhodium (Rh) or a multilayer structure of copper and ruthenimum (Cu/Ru).

9. A superconducting memory array comprising multiple instances of the HMJJ device of claim 1 arranged in rows and columns, with multiple word write lines and bit write lines respectively provided to the HMJJ devices of claim 1 to addressably write binary logical states to the individual HMJJ devices of claim 1, and with word read lines and bit read lines provided to the HMJJ devices of claim 1 to addressably read the binary logical states.

10. A Josephson magnetic memory cell system comprising:

a hysteretic magnetic Josephson junction (HMJJ) configured to store a binary value and to convert superconducting pairs associated with the read current flowing through the HMJJ from a singlet-state to a triplet-state;

a write circuit magnetically coupled to the HMJJ and configured to write the binary value into the HMJJ in response to at least one write current; and a read circuit configured to determine the binary value stored in the HMJJ in response to application of a read current to the HMJJ, wherein the HMJJ comprises a first ferrimagnetic material layer having a fixed magnetization and a second ferrimagnetic material layer having a free magnetization corresponding to a bi-stable orientation, wherein the first and second ferrimagnetic material layers have a magnetic polarity that is substantially orthogonal with respect to a first ferromagnetic layer adjacent the first ferrimagnetic layer and a second ferromagnetic layer adjacent the second ferrimagnetic layer.

11. The system of claim 10, further comprising a second Josephson junction arranged in parallel with the HMJJ and configured to conduct at least a portion of the read current, a magnetic flux in between the HMJJ and the second Josephson junction in response to the read current being indicative of the binary value stored in the HMJJ.

12. The system of claim 10, wherein the HMJJ further comprises a first superconducting material layer having a first side disposed on a second side of the first ferromagnetic layer and a second superconducting material layer having a first side disposed on a second side of the second ferromagnetic layer, wherein a second side of the first superconducting layer and a second side of the second superconducting layer are configured as opposing galvanic contacts.

13. The system of claim 12, wherein the first superconducting material layer and the second superconducting material layer are formed from one of niobium, niobium nitride, and aluminum.

14. The system of claim 10, wherein the at least one HMJJ further comprises a non-magnetic spacer disposed between the first ferromagnetic layer and the second ferromagnetic layer.

15. The system of claim 14, wherein the non-magnetic spacer layer is made of one of elemental copper (Cu), elemental ruthenium (Ru), elemental iridium (Ir), elemental rhodium (Rh) or a multilayer structure of copper and ruthenimum (Cu/Ru).

16. The system of claim 10, wherein the first ferrimagnetic layer and the second ferrimagnetic layer are formed from a composition of material with the formula $RE_xTM_{1-x}$, where RE is a rare earth metal selected from among gadolinium (Gd), terbium (Tb), dysprosium (Dy), holmium (Ho), erbium (Er), or thulium (Tm), and TM is a ferromagnetic transition metal selected from among iron (Fe), nickel (Ni), or cobalt (Co), where $0<x<1$.

17. The system of claim 16, wherein the first ferrimagnetic layer and the second ferrimagnetic layer are each formed from a gadolinium (Gd) and Iron (Fe) alloy with a composition of about 20% gadolinium (Gd) and 80% Iron (Fe).

18. The system of claim 10, wherein the first ferromagnetic layer is made of any of elemental cobalt, elemental iron, a cobalt-iron alloy, a nickel-iron alloy, or a nickel-iron-chromium alloy.

19. The system of claim 10, wherein the second ferromagnetic layer is a nickel-iron 80:20 permalloy.

20. A Josephson magnetic random access memory (JM-RAM) comprising a plurality of the Josephson magnetic memory cell systems of claim 10 arranged as an array of rows and columns, each of the Josephson magnetic memory cell systems being configured to store the respective binary value in response to a word-write current that is provided on a word-write line and a bit-write current that is provided on a bit-write line, and being further configured to output the respective binary value in response to a word-read current that is provided on a word-read line and a bit-read current that is provided on a bit-read line.

* * * * *